US010915029B2

(12) United States Patent
Rupp et al.

(10) Patent No.: US 10,915,029 B2
(45) Date of Patent: Feb. 9, 2021

(54) PARTICLE IRRADIATION APPARATUS, BEAM MODIFIER DEVICE, AND SEMICONDUCTOR DEVICE INCLUDING A JUNCTION TERMINATION EXTENSION ZONE

(71) Applicant: Infineon Technologies AG, Neubiberg (DE)

(72) Inventors: Roland Rupp, Lauf (DE); Rudolf Elpelt, Erlangen (DE); Romain Esteve, Villach (AT)

(73) Assignee: Infineon Technologies AG

( * ) Notice: Subject to any disclaimer, the term of this patent is extended or adjusted under 35 U.S.C. 154(b) by 28 days.

(21) Appl. No.: 16/153,186

(22) Filed: Oct. 5, 2018

(65) Prior Publication Data

US 2019/0049850 A1 Feb. 14, 2019

Related U.S. Application Data

(62) Division of application No. 15/249,758, filed on Aug. 29, 2016, now Pat. No. 10,120,287.

(30) Foreign Application Priority Data

Aug. 28, 2015 (DE) .................. 10 2015 114 429

(51) Int. Cl.
*H01L 29/16* (2006.01)
*H01L 29/36* (2006.01)
(Continued)

(52) U.S. Cl.
CPC ...... *G03F 7/70008* (2013.01); *G03F 7/70775* (2013.01); *H01J 37/3171* (2013.01);
(Continued)

(58) Field of Classification Search
CPC ............ G03F 7/70008; G03F 7/70775; H01L 29/8611; H01L 29/6606; H01L 29/66068;
(Continued)

(56) References Cited

U.S. PATENT DOCUMENTS

| 4,158,141 A | 6/1979 | Seliger et al. |
| 4,278,475 A | 7/1981 | Bartko et al. |

(Continued)

FOREIGN PATENT DOCUMENTS

GB 2078441 A 1/1982

OTHER PUBLICATIONS

Csato et al., Energy filter for tailoring depth profiles in semiconductor doping application, Nuclear Instruments and Methods in Physics Research Section B: Beam Interactions with Materials and.Atoms 365 (2015), S. 182-186.

(Continued)

*Primary Examiner* — David Vu
(74) *Attorney, Agent, or Firm* — Design IP

(57) ABSTRACT

A semiconductor device is provided that includes a silicon carbide substrate including a main surface at which a plurality of doped zones are formed in a junction termination extension zone of the silicon carbide substrate, the plurality of doped zones are arranged such that a lateral dopant concentration gradient is formed that decreases from a central region of the silicon carbide substrate to an outer edge region of the silicon carbide substrate.

20 Claims, 16 Drawing Sheets

(51) Int. Cl.
  *H01L 29/66* (2006.01)
  *G03F 7/20* (2006.01)
  *H01L 21/04* (2006.01)
  *H01J 37/317* (2006.01)
  *H01L 29/861* (2006.01)
  *H01L 21/027* (2006.01)
  *H01L 23/544* (2006.01)
  *H01L 29/06* (2006.01)

(52) U.S. Cl.
  CPC ...... *H01L 21/0273* (2013.01); *H01L 21/0465* (2013.01); *H01L 23/544* (2013.01); *H01L 29/0615* (2013.01); *H01L 29/1608* (2013.01); *H01L 29/36* (2013.01); *H01L 29/6606* (2013.01); *H01L 29/66068* (2013.01); *H01L 29/8611* (2013.01); *H01L 2223/5446* (2013.01); *H01L 2223/54426* (2013.01)

(58) Field of Classification Search
  CPC . H01L 21/0465; H01L 29/36; H01L 29/1608; H01L 29/0615; H01L 23/544; H01L 21/0273; H01L 2223/5446; H01L 2223/54426; H01J 37/3171; H01J 2237/02; H01J 2237/30; H01J 37/317; H01J 37/30; H01J 37/09; G21K 1/10
  See application file for complete search history.

(56) References Cited

U.S. PATENT DOCUMENTS

| | | |
|---|---|---|
| 5,831,313 A | 11/1998 | Han et al. |
| 6,087,669 A | 7/2000 | Suzuki |
| 6,614,033 B2 | 9/2003 | Suguro et al. |
| 8,900,962 B2 | 12/2014 | Yamashita et al. |
| 2002/0175298 A1 | 11/2002 | Moniwa et al. |
| 2010/0289032 A1* | 11/2010 | Zhang .............. H01L 29/36 257/77 |

OTHER PUBLICATIONS

Weber et al., Design and construction of a ripple filter for a smoothed depth dose distribution in conformal particle therapy, Physics in Medicine and Biology 44 (1999), S. 2765-2775.

* cited by examiner

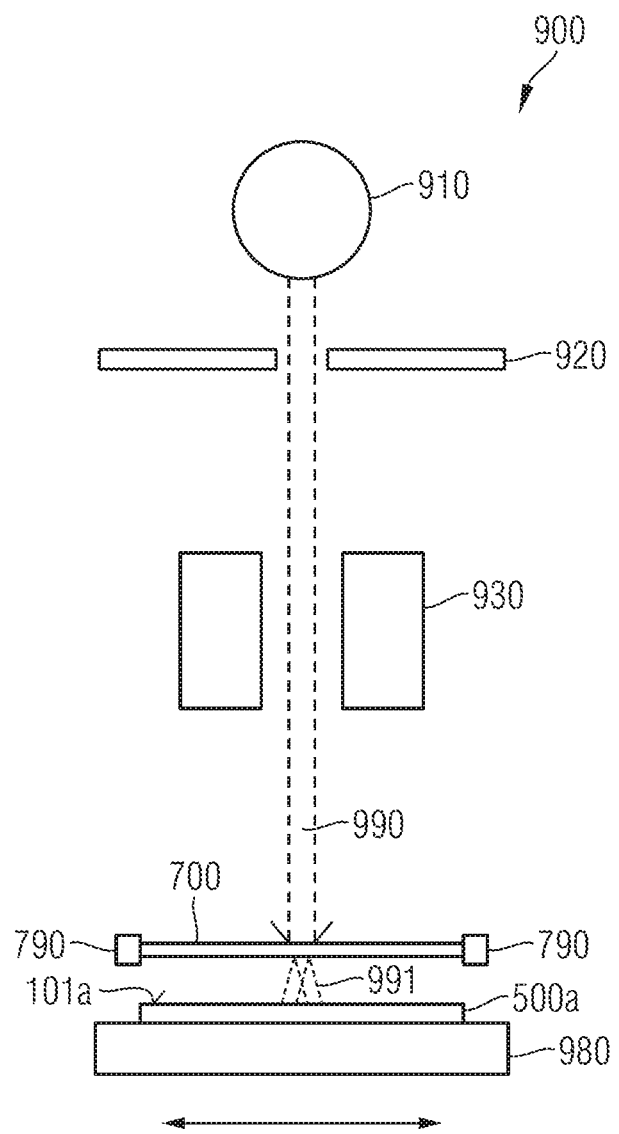

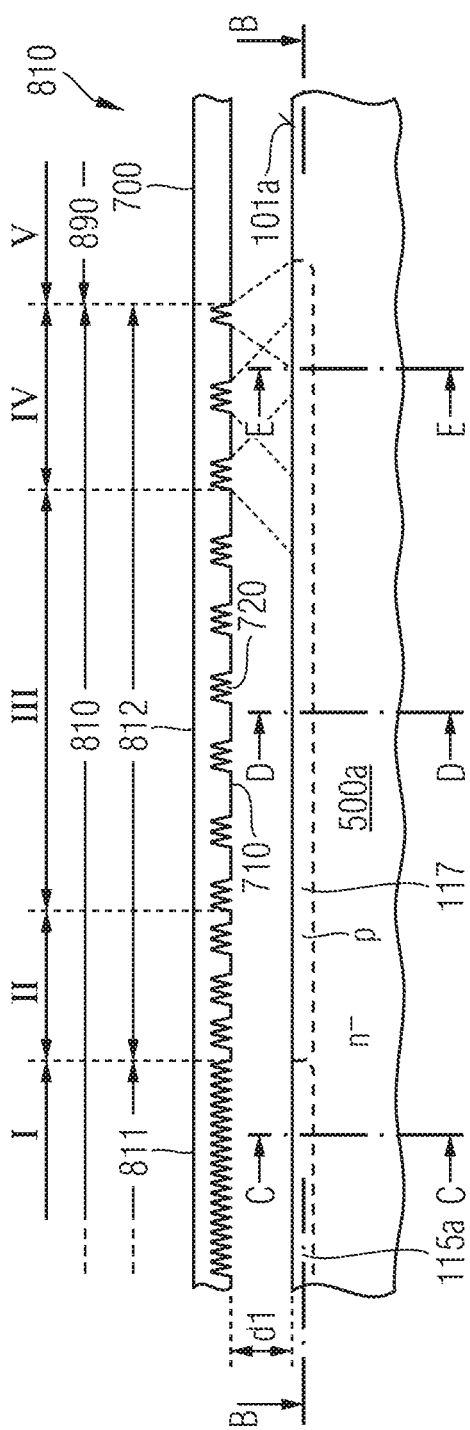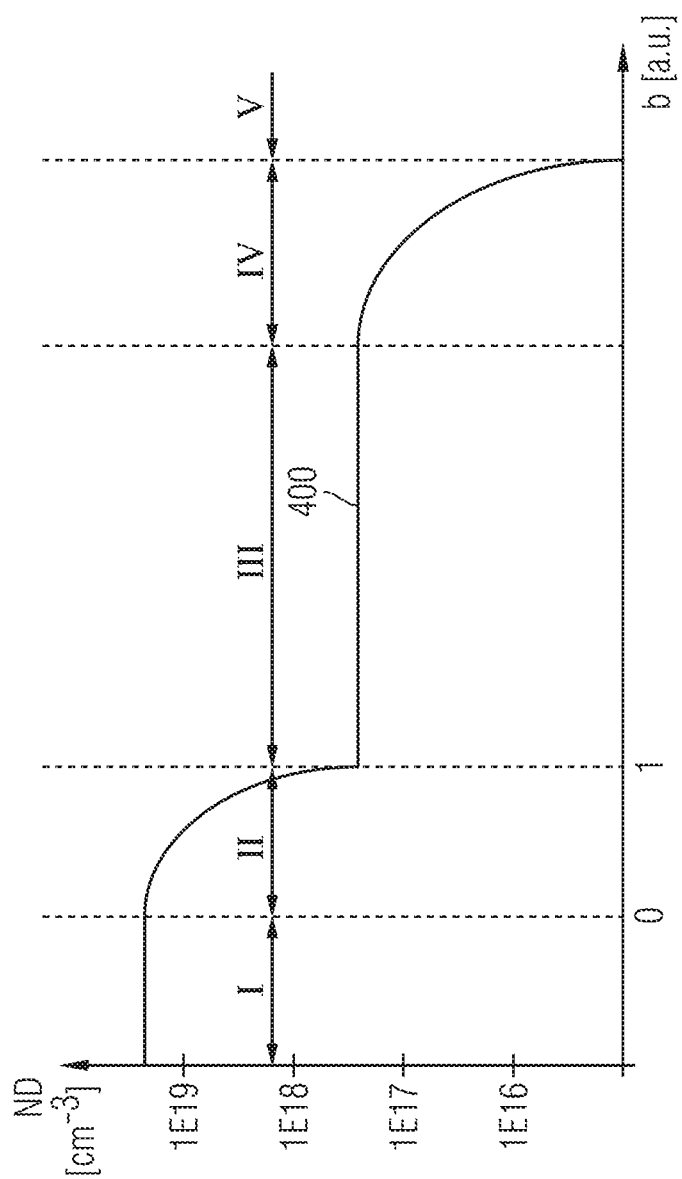
FIG 4A
FIG 4B

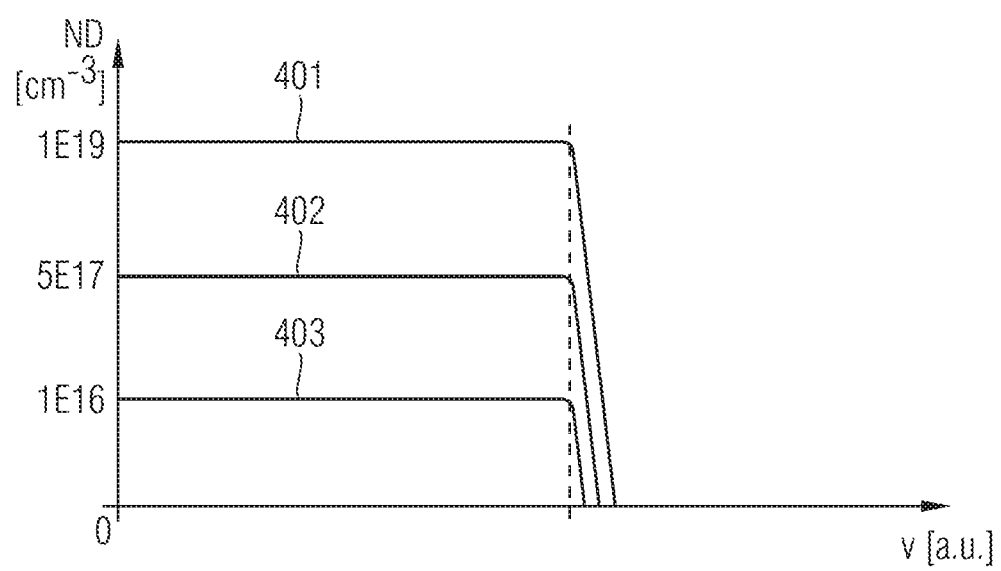

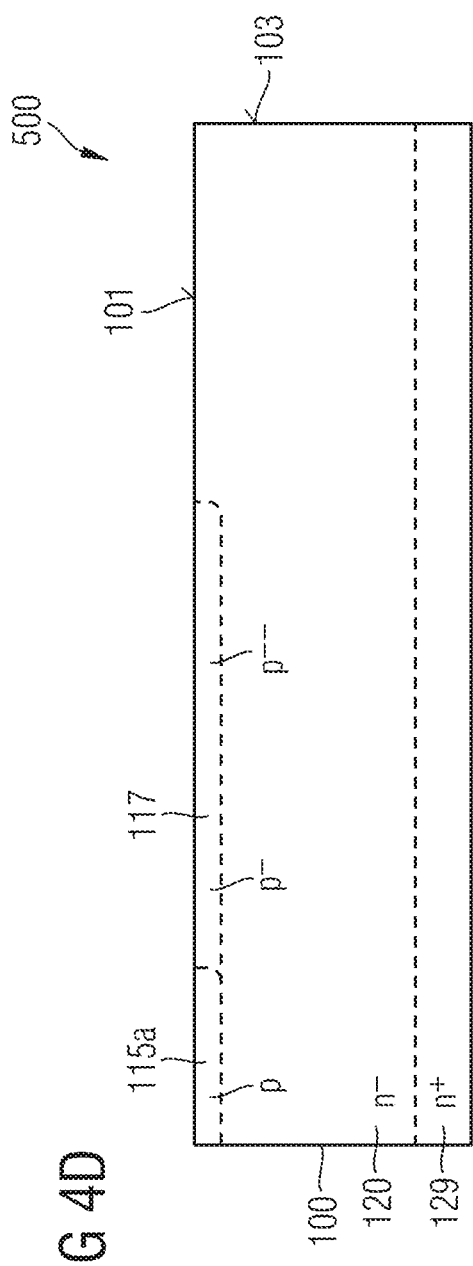
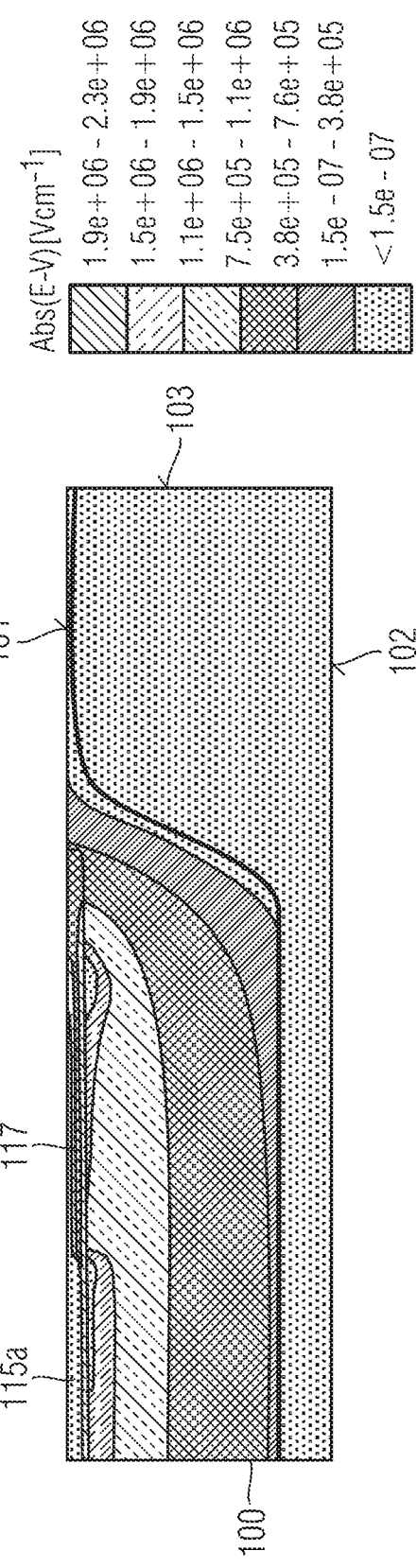

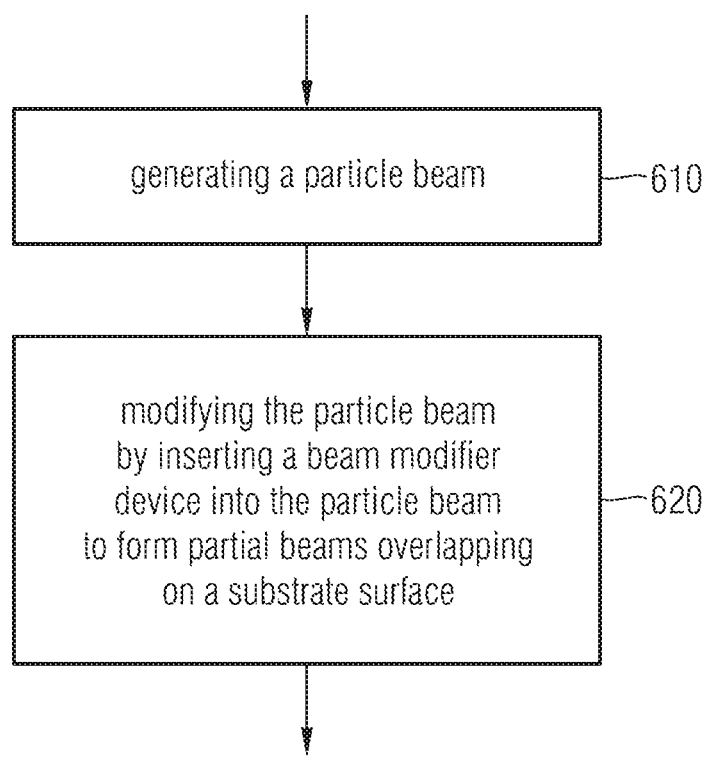

PARTICLE IRRADIATION APPARATUS, BEAM MODIFIER DEVICE, AND SEMICONDUCTOR DEVICE INCLUDING A JUNCTION TERMINATION EXTENSION ZONE

CROSS REFERENCE TO RELATED APPLICATIONS

This application is a divisional of U.S. patent application Ser. No. 15/249,758, filed Aug. 29, 2016, which claims the benefit of German Patent Application No. 10 2015 114 429.8 filed Aug. 28, 2015, which are incorporated by reference as if fully set forth.

BACKGROUND

In power semiconductor devices a blocking voltage applied between a first load electrode at a front side and a second load electrode on the back of a semiconductor die forms a depletion zone along a main pn junction. Since along a lateral outer surface the blocking capability of the semiconductor die is low, the main pn junction is typically designed such that the depletion zone extends from a central doped zone into the lateral direction and such that the lateral outer surface remains free of electric fields. As a consequence, lateral and vertical components of an electric field between the first and second load electrodes may superimpose along a curved section of the blocking main pn junction. Lateral junction termination extensions with gradually decreasing dopant concentration expand a central doped zone along a surface of the semiconductor die at the front side, flatten the curved section of the main pn junction, and improve the blocking capability. In semiconductor materials in which dopants have a sufficient diffusion length, lateral junction termination extensions of the central doped zone form a gradual transition between the central doped zone and the surrounding edge region by diffusion of dopants implanted through a small number of implants using different implant masks. In semiconductor devices based on materials, in which diffusion length of the dopants is low, a high number of implants with different implant masks may form a junction termination extension in which the dopant concentration varies with sufficient smoothness. Alternatively, one single implant may use an implant mask with openings which diameters decrease with decreasing distance to the edge region or one single implant may use a wedge-shaped implant mask to form graded junction termination extensions.

There may be a need to simplify formation of doped zones with laterally varying concentration of dopants in semiconductor materials in which a diffusion length of dopants is low.

SUMMARY

According to an embodiment a beam modifier device includes scattering portions. In the scattering portions a total permeability for particles vertically impinging on an exposure surface of the beam modifier device changes along a lateral direction parallel to the exposure surface.

According to another embodiment a particle irradiation apparatus includes a particle source capable of emitting particles, an acceleration unit capable of accelerating the emitted particles to form a particle beam, and a beam modifier device that includes scattering portions, wherein in the scattering portions a total permeability for the particles vertically impinging on an exposure surface of the beam modifier device changes along a lateral direction parallel to the exposure surface.

According to a further embodiment a method of manufacturing a semiconductor device includes generating a particle beam and modifying the particle beam by use of a beam modifier device. Shading portions of the beam modifier device attenuate first partial beams of the particle beam. Scattering portions scatter second partial beams of the particle beam, wherein cones of the second partial beams passing through neighboring ones of the scattering portions overlap in a semiconductor substrate in a plane perpendicular to a propagation direction of the particle beam.

According to a further embodiment a semiconductor device, includes a central doped zone extending from a first surface into a silicon carbide semiconductor portion at a distance to an outer lateral surface of the semiconductor portion. The central doped zone forms a pn junction with a drift structure in the semiconductor portion. A termination extension zone forms a unipolar homojunction with the central doped zone, wherein the termination extension zone extends along the first surface from the central doped zone into a direction of the outer lateral surface. A lateral doping profile of the termination extension zone parallel to the first surface includes portions of uniform dopant concentration connected through portions of approximately linearly decreasing dopant concentration.

According to an embodiment a beam modifier device includes shading portions and scattering portions. In the scattering portions a total permeability for particles is higher than in the shading portions and particles vertically impinging on an exposure surface of the beam modifier device are deflected from a vertical direction. The shading and scattering portions alternate along a lateral direction parallel to the exposure surface. An area ration of the shading portions changes along the lateral direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the described embodiments and are incorporated in and constitute a part of this specification. The drawings illustrate the embodiments and together with the description serve to explain principles of the embodiments. Other embodiments and intended advantages will be readily appreciated as they become better understood by reference to the following detailed description.

FIG. 3 is a schematic block diagram of a particle irradiation apparatus according to an embodiment including a beam modifier device.

FIG. 4A is a schematic vertical cross-sectional view through a portion of a beam modifier device and a semiconductor substrate for illustrating effects of an embodiment concerning doped zones with laterally varying dopant concentration.

FIG. 4B is a schematic diagram illustrating a lateral dopant gradient along line B-B parallel to a main surface of the semiconductor substrate of FIG. 4A.

FIG. 4C is a schematic diagram illustrating vertical dopant gradients along lines C-C, D-D, and E-E orthogonal to the main surface of the semiconductor substrate of FIG. 4A.

FIG. 4D is a schematic vertical cross-sectional view of a portion of a semiconductor device obtained from the semiconductor substrate of FIG. 4A.

FIG. 4E is a schematic illustration of an electric field in the vertical cross-sectional view of FIG. 4D.

FIG. 6 is a schematic flowchart of a method of manufacturing a semiconductor device, wherein the method includes formation of doped regions by the use of a beam modifier device.

DETAILED DESCRIPTION

In the following detailed description, reference is made to the accompanying drawings, which form a part hereof and in which are shown by way of illustrations specific embodiments which may be practiced. It is to be understood that other embodiments may be utilized and structural or logical changes may be made without departing from the scope of the general inventive concept. For example, features illustrated or described for one embodiment can be used on or in conjunction with other embodiments to yield yet a further embodiment. It is intended that the general inventive concept includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or a highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
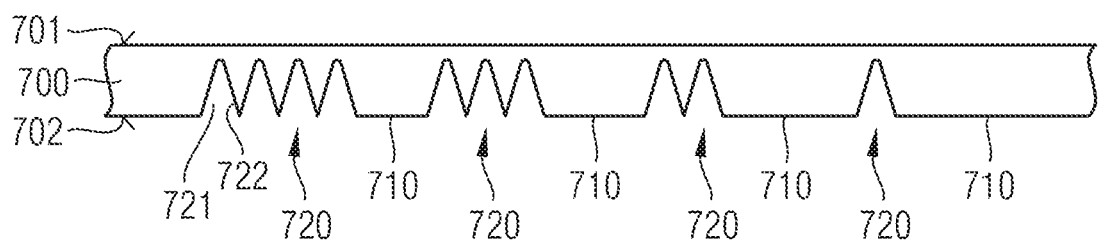
FIG. 1A is a schematic vertical cross-sectional view of a portion of a beam modifier device with a lateral variation of a ratio between shading and scattering portions according to an embodiment with the scattering portions including dents and triangular protrusions.
Figure 1B:
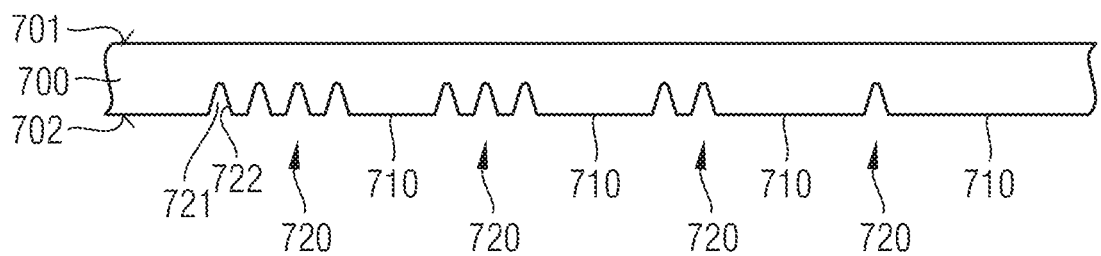
FIG. 1B is a schematic vertical cross-sectional view of a portion of a beam modifier device with a lateral variation of a ratio between shading and scattering portions according to an embodiment with the scattering portions including trapezoid protrusions.

FIGS. 1A and 1B refer to beam modifier devices 700 for modifying a particle beam directed onto a semiconductor substrate for forming VLD (variation of lateral doping) zones and/or for forming differently doped zones in one single implant.

The beam modifier device 700 is based on one or more materials which form sufficiently stable structures at a thickness at which the materials are sufficiently permeable for particle beams as used for implanting dopants into semiconductor substrates with short diffusion lengths for the dopant atoms, e.g. silicon carbide (SiC).

For example, the beam modifier device 700 is based on materials which form stable thin substrates like foils, for example square foils with an edge length of about 75 mm or more, e.g., about 200 mm or 300 mm or round foils with a diameter of at least 100 mm, e.g., about 200 mm or 300 mm. A thickness at which the beam modifier device 700 is sufficiently permeable for particles used as dopants for crystalline substrates with short diffusion length for the respective dopant, e.g., particles with a molecular weight equal to or greater 5 and at most, e.g., 54, at a kinetic energy of about 200 keV. According to an embodiment, the beam modifier device 700 mainly contains or consists of aluminum (Al) or silicon (Si). In some other embodiments, the beam modifier device 700 may consist of or may be based on other materials with the desired properties with respect to particle beams. For example, the beam modifier device 700 may be mainly based on a layer of crystalline silicon with a thickness in a range from 100 nm to 20 μm, which may be coated with a metal-containing layer to improve stability, ruggedness and/or scattering properties. Permeable portions of the beam modifier device 700 may attenuate the energy of passing particles.

The beam modifier device 700 may be a thin substrate, a membrane or a foil with an exposure surface 701 that may be planar or that may include features protruding from the exposure surface 701. Opposite to the exposure surface 701, a patterned surface 702 may include grooves and mesas, wherein a mean plane of the grooves and mesas is parallel to the exposure surface 701. The patterned surface 702 may be patterned by etching processes or by processes using a template or cast, e.g., by casting, by press molding or by stamping, wherein the beam modifier device 700 is based on a suitable material for etching, press molding, casting or stamping.

The beam modifier device 700 includes shading portions 710 and scattering portions 720. In addition to the shading portions 710 and the scattering portions 720 the beam modifier device 700 may include further portions, e.g., fully absorptive and/or fully or approximately transparent regions for the particles of the particle beam, e.g., openings.

The shading portions 710 are less permeable for the particles of the particle beam than the scattering portions 720. For example, in the scattering portions 720 the permeability for particles with molecular weight in a range from 5 to 54 may be at least ten times higher than in the shading portions 710. For example, the shading portions 710 may be impermeable for particles with molecular weight equal to or greater than five, at a kinetic energy of at most 2 MeV. The permeability of all shading portions 710 may be the same. According to other embodiments, different shading portions 710 may have different permeability. Alternatively or in addition, the permeability for particles with molecular weight from 5 to 54 may fluctuate within the same shading portion 710. The shading portions 710 may locally attenuate first partial beams of a modified particle beam exiting the beam modifier device 700 through the patterned surface 702 in the shading portions 710 by at least one order of magnitude more than the scattering portions 720 attenuate second partial beams, or may be almost or completely impermeable for the particles, wherein the modified particle beam is devoid of first partial beams.

In the scattering portions 720 a minimum vertical extension of the beam modifier device 700 is smaller than a minimum vertical extension in the shading portions 710 such that portions of a particle beam impinging onto the exposure surface 701 in the scattering portions 720 pass the scattering portions 720 at lower attenuation than in the shading portions 710. In addition, the scattering portions 720 scatter the passing particles and expand cones of the second partial beams of a modified particle beam exiting the beam modifier device 700 through the patterned surface 702 in the scattering portions 720.

The scattering portions 720 may be patterned such that the scattering portions 720 include dents 721 extending at the side of the patterned surface 702 into the beam modifier device 700 as well as protrusions 722 between neighboring dents 721. The dents 721 in the same scattering portion 720 may have the same vertical and horizontal extensions or different vertical and/or horizontal extensions. The dents 721 of different scattering portions 720 may have the same or different vertical and horizontal extensions. According to an embodiment, the dents 721 may have a vertical extension in a range from 100 nm to 10 μm, for example in a range from 0.2 μm to 8 μm.

Vertical cross-sections of the dents 721 and the protrusions 722 may be rectangles with or without rounded or beveled edges, triangles with or without flattened top or columns with rounded or semicircular tops. The dents 721 may be stripe-shaped grooves, may be isolated, short trenches or may form a grid separating neighboring protrusions 722 in two orthogonal horizontal directions. In the illustrated embodiment, the vertical cross-sections of both the dents 721 and the protrusions 722 are triangles of the same vertical extension.

The beam modifier device 700 of FIG. 1B includes dents 721 and protrusions 722 with trapezoid cross-sections and equal vertical extensions.

Figure 1C:
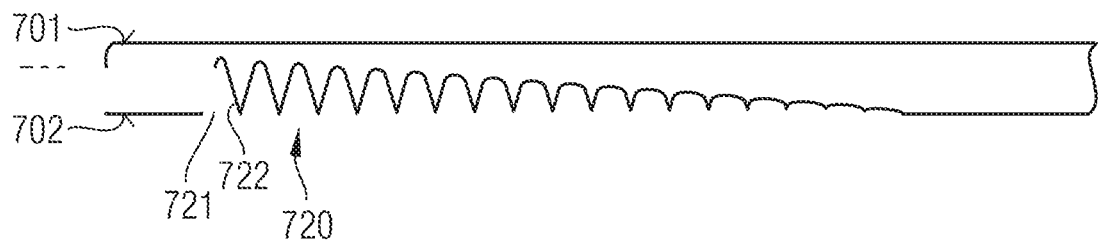
FIG. 1C is a schematic vertical cross-sectional view of a portion of a beam modifier device with a lateral variation of a distance between an exposure surface and dents in a scattering portion according to an embodiment with trapezoid protrusions.

The beam modifier device 700 of FIG. 1C laterally varies a vertical extension of trapezoidal dents 721 and trapezoidal protrusions 722. With shallower dents 721 a distance between the bottom of the dents 721 and the exposure surface 701 may increase such that the portion of passing particles decreases with decreasing vertical extension of the dents 721.

Figure 1D:
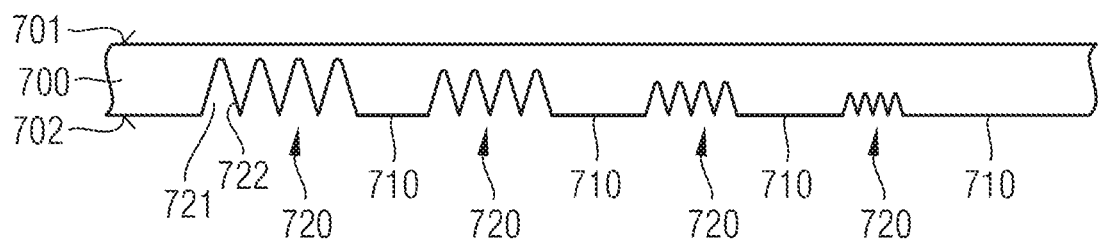
FIG. 1D is a schematic vertical cross-sectional view of a portion of a beam modifier device with a lateral variation of a ratio between shading and scattering portions according to an embodiment with the scattering portions including dents and triangular protrusions with different vertical extensions.

FIG. 1D combines different vertical extensions of the dents 721 in scattering portions 720 with shading regions 710 as described with reference to FIGS. 1A to 1B, wherein the vertical extensions of protrusions 722 and dents 721 of different scattering portions 720 differ from each other. With shallower dents 721 a distance between the bottom of the dents 721 and the exposure surface 701 may increase such that less particles pass the beam modifier device 700 in scattering portions with shallow dents 721 than in scattering portions with deep dents 721. In addition or alternatively, the vertical extensions of protrusions 722 and dents 721 may change within the same scattering portion 720.

Figure 1E:
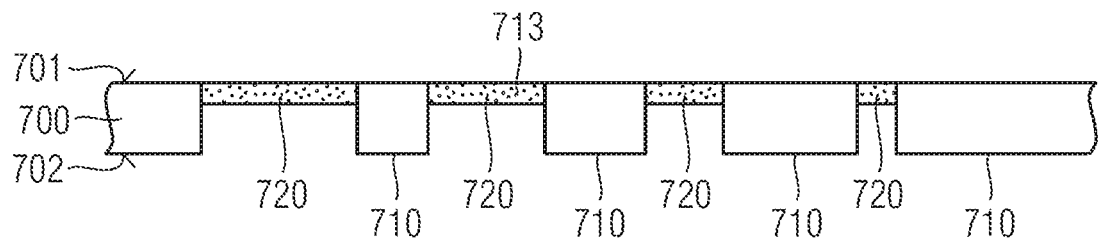
FIG. 1E is a schematic vertical cross-sectional view of a portion of a beam modifier device with a lateral variation of a ratio between shading and scattering portions according to an embodiment with the scattering portions including embedded scatter centers.

Alternatively or in addition, the scattering portions 720 may scatter the particles due to material properties. For example, scattering may be caused by the material matrix of the beam modifier device 700 and/or by scatter centers 713 as illustrated in FIG. 1E, wherein the scatter centers 713 may be crystal lattice defects or metal atoms within the beam modifier device 700. Scattering due to material properties may result in Gaussian distribution profiles for the scattered particles, whereas scattering induced by surface patterns results in more box-shaped distribution profiles. According to an embodiment, a thin metal-containing layer lining the crystalline base material at the side of the patterned surface 702 may contain the scatter centers 713.

An area ratio of the shading portions 710, i.e., the area of the patterned surface 702 occupied by the shading portions 710 per unit area, changes along the horizontal extension of the beam modifier device 700 parallel to the exposure surface 701. In combination with the scatter properties of the scattering portions 720, the variable area ratio of the shading portions 710 simplifies the formation of doped zones of different dopant concentrations and/or the formation of doped zones with smooth lateral concentration gradients in semiconductor materials in which within an allowable temperature range, e.g., up to 1800° C. for silicon carbide (SiC) diffusion lengths of typical dopants are significantly shorter than in crystalline silicon. The beam modifier device 700 facilitates a lateral modulation of the distribution of particles, e.g., dopants in a semiconductor substrate exposed to the modified particle beam.

FIGS. 2A to 2E refer to the use of beam modifier devices 700 for a lateral variation of doping in junction termination extension zones.

Figure 2A:
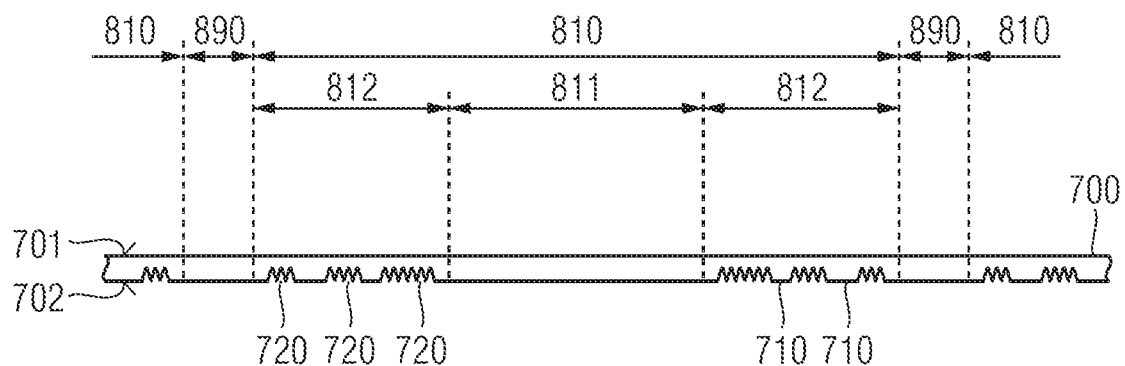
FIG. 2A is a schematic vertical cross-sectional view of a portion of a beam modifier device with an idle region separating device regions according to an embodiment including central device regions based on shading portions.

FIG. 2A shows a beam modifier device 700 with a grid-shaped idle region 890 separating a plurality of identical device regions 810 for use in combination with a semiconductor substrate from which a plurality of identical semiconductor devices are formed.

Each device region 810 includes a central region 811 that corresponds in shape and dimensions with an active area of one of the semiconductor devices, wherein the active area may include operable transistor cells of MPS (Merged-PN-Schottky) diodes, IGFETs (insulated gate field effect transistors), or IGBTs (insulated gate bipolar transistors), or heavily doped anode zones of power semiconductor diodes. The central region 811 may include one single shading portion 710 and may be devoid of scattering portions 720. Each device region 810 further includes a termination region 812 that directly adjoins to and surrounds the central region 811. Each termination region 812 corresponds in shape and, approximately, in dimensions with a junction termination extension zone of the corresponding semiconductor device.

The idle region 890 of the beam modifier device 700 corresponds in shape and dimensions with an area on the semiconductor substrate that includes a kerf area, a wafer edge area, and not-counterdoped termination areas of individual chip areas. The wafer edge area is a portion of the semiconductor substrate along a wafer edge in which no semiconductor dies are formed. The kerf area is a portion of the semiconductor substrate consumed in a process for separating from each other semiconductor dies formed in neighboring chip areas of the same semiconductor substrate. A not-counterdoped termination area is the outermost chip area sandwiched between the junction termination extension zone and an outer edge of the chip area.

In the termination region 812 circumferential scattering and shading portions 710, 720 alternatingly surround the central region 811. Within each termination region 812 an area ratio of shading portions 710 per unit area increases with increasing distance to the central region 811 by increasing width of the shading portions 710 at constant width of the scattering portions 720, by decreasing width of the scattering portions 720 at constant width of the shading portions 710, or by a combination of both. In the illustrated embodiment, close to the central region 811 the area ratio of the shading portions 710 is about 1:4, whereas close to the idle region 890 the area ratio of the shading portions 710 approximates 1:1.

The shading portions 710 locally attenuate the particle beam impinging onto the exposure surface 701. Since the area density of the shading portions 710 increases with decreasing distance to the idle region 890, fewer particles pass through the beam modifier device 700 in a portion of the termination region 812 close to the idle region 890 than in a portion close to the central region 811.

Since the scattering portions 720 locally widen up the cones of partial beams of the modified particle beam exiting the patterned surface 702 in the scattering portions 720, particles passing through the scattering portions 720 reach also areas in the vertical projection of the shading portions 710.

The beam modifier device 700 facilitates formation VLD zones, e.g., junction termination extensions with a variation of lateral doping for semiconductor devices with short diffusion lengths for dopants, e.g., silicon carbide power switches and silicon carbide diodes.

Figure 2B:
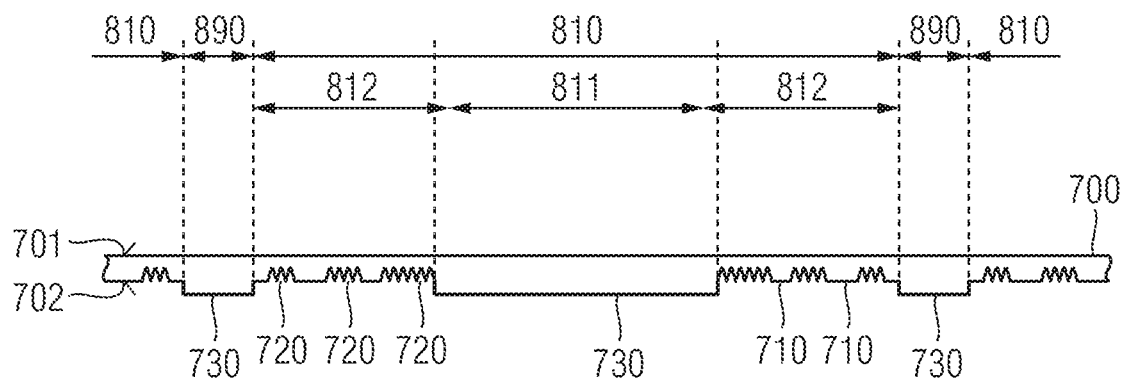
FIG. 2B is a schematic vertical cross-sectional view of a portion of a beam modifier device according to an embodiment with an enforced idle region separating device regions including enforced central device regions.

FIG. 2B shows highly absorptive portions 730 in the central and idle regions 811, 890. A vertical extension of the highly absorptive portions 730 may be higher than a vertical extension of the shading portions 710 to improve mechanical stability of the beam modifier device 700.

Figure 2C:
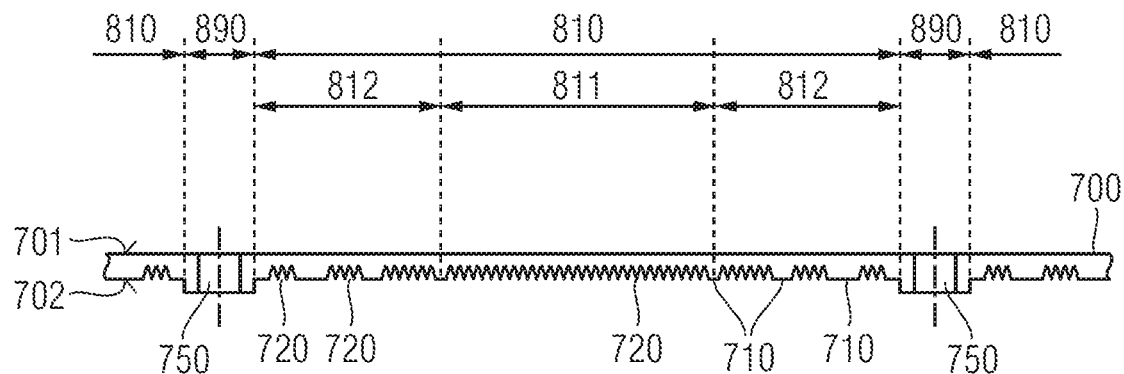
FIG. 2C is a schematic vertical cross-sectional view of a portion of a beam modifier device according to an embodiment with openings for the formation of alignment marks.

In FIG. 2C the central region 811 includes a single scattering portion 720 and is devoid of shading portions 710 such that a central doped zone, e.g., an anode zone of a power semiconductor diode or a body zone for transistor cells in an active area of a semiconductor device can be implanted in the same implantation process that forms a junction termination extension zone with lateral variation of doping.

The beam modifier device 700 may further include openings 750, for example, in the idle region 890. The openings 750 allow a high-dose particle beam to partially pass and to amorphize portions of a semiconductor substrate, e.g., for the formation of alignment marks.

Figure 2D:
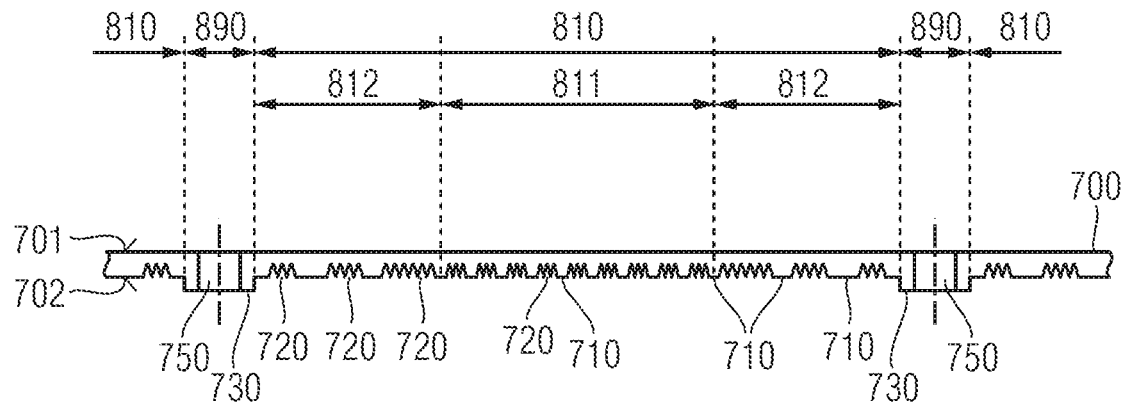
FIG. 2D is a schematic vertical cross-sectional view of a portion of a beam modifier device with an idle region separating device regions according to an embodiment with central device regions including both shading and scattering portions.

In FIG. 2D the central region 811 includes a regular arrangement of scattering portions 720 separated by shading portions 710 to adjust the dopant concentration in a central doped zone with respect to the dopant concentration in the junction termination extension zone.

Figure 2E:
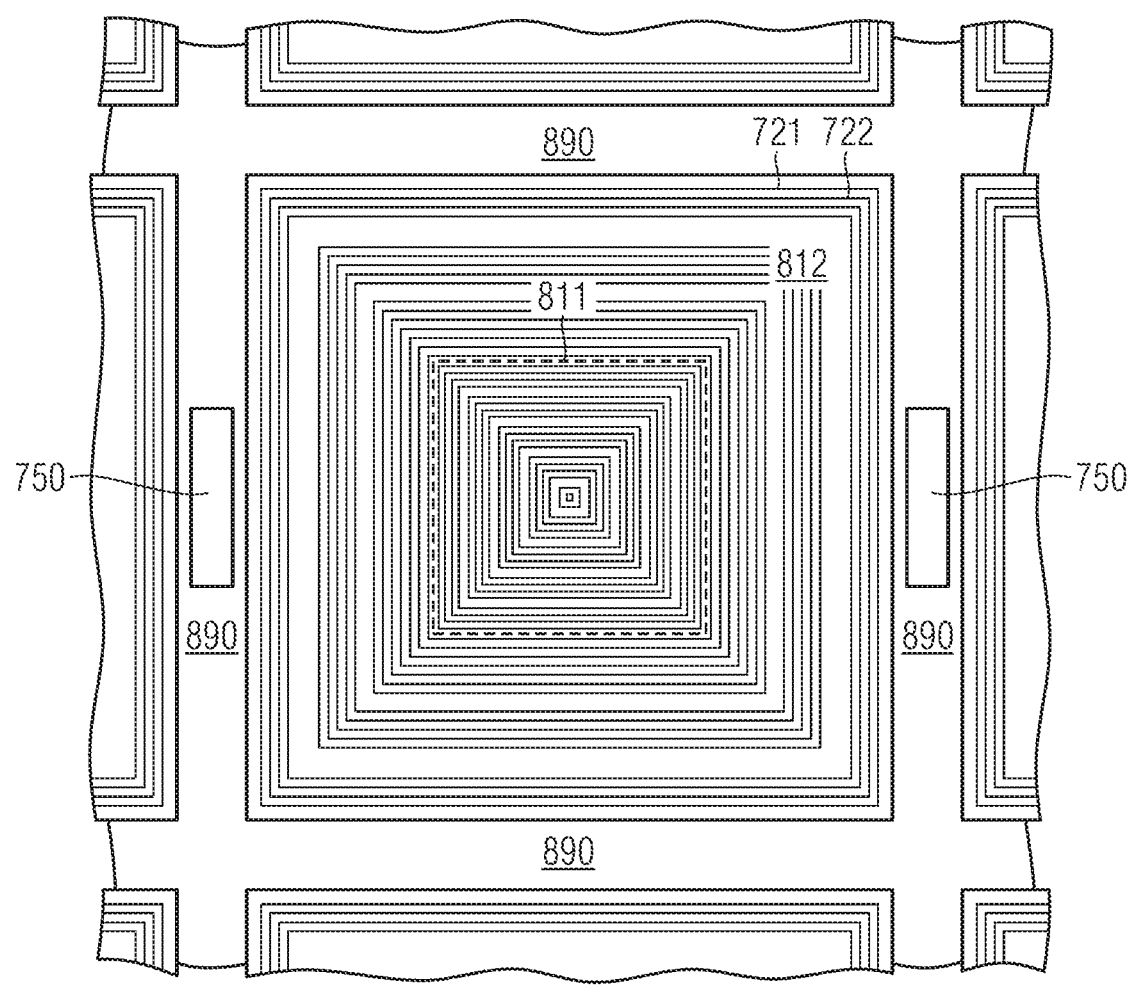
FIG. 2E is a schematic plan view on a patterned surface of the beam modifier device of FIG. 2D.

FIG. 2E shows the patterned surface 702 of the beam modifier device 700 of FIG. 2D. Each termination region 812 surrounds a central region 811. In the termination region 812 the shading portions 710, the scattering portions 720 as well as the protrusions 722 and dents 721 are concentric, circular structures that surround the central region 811. According to other embodiments, the protrusions 722 and dents 721 may be stripe-shaped.

FIG. 3 shows a particle irradiation apparatus 900. A particle source 910 emits charged particles, e.g., ions with molecular weight equal to or greater one. An acceleration unit 920, e.g., a VandeGraaff accelerator may accelerate a selected type of charged particles and may filter out charged particles of other types than the selected type. A beam guiding unit 930 may guide and focus the accelerated particles to form a particle beam 990 containing the accelerated charged particles and may direct the particle beam 990 at a predefined implant angle, e.g., approximately perpendicular, onto a substrate, e.g., a semiconductor substrate 500a, which may be fixed, for example, electrostatically chucked onto a surface of a substrate carrier 980.

The substrate carrier 980 may be moveable with respect to the particle beam 990 along at least one axis, and/or the beam guiding unit 930 may deflect the particle beam 990 with respect to the substrate carrier 980 along at least one axis, or the particle irradiation apparatus 900 may combine both.

A beam modifier device 700 is arranged between the beam guiding unit 930 and the semiconductor substrate 500a. For example, the beam modifier device 700 is mounted in a frame 790 which is insertable in and removable from a retaining fixture integrated in the particle irradiation apparatus 900.

The beam modifier device 700 attenuates and scatters the passing particles. The particles exiting the beam modifier device 700 form a modified particle beam including a plurality of partial beams 991 impinging onto a main surface 101a of the semiconductor substrate 500a, wherein the partial beams 991 laterally overlap with each other.

The semiconductor substrate 500a may be a semiconductor wafer, for example a wafer composed of a semiconductor material in which dopant atoms have a short diffusion length. For example, the semiconductor substrate 500a is a silicon carbide wafer with a diameter of 76 mm, 100 mm, 200 mm, 300 mm and a thickness in a range from 50 μm to 1000 μm, e.g., from 100 μm to 400 μm.

According to an embodiment, the beam modifier device 700 is fixed with respect to the substrate carrier 980 and may have a lateral extension corresponding to a lateral extension equal to or greater than the semiconductor substrate 500a, wherein the beam modifier device 700 includes a plurality of identical device regions and each device region of the beam modifier device 700 corresponds to a combination of an active area and a junction termination extension zone of a semiconductor die formed in the semiconductor substrate 500a.

According to another embodiment the beam modifier device 700 is moveable with respect to the substrate carrier 980, wherein a lateral extension of the beam modifier device 700 is significantly smaller than a horizontal extension of the semiconductor substrate 500a. For example, the beam modifier device 700 includes only one single, two, four or more device regions and a position of the beam modifier device 700 with respect to the semiconductor substrate 500a changes during irradiation of the semiconductor substrate 500a with the modified particle beam. A scanner may move the semiconductor substrate 500a with respect to the modified particle beam such that the modified particle beam scans the complete semiconductor substrate 500a.

FIGS. 4A to 4G illustrate an application of a beam modifier device 700 for forming a p-type JTE zone 117 in which a dopant concentration gradually changes from a high value to a low value.

FIG. 4A shows a beam modifier device 700 placed at a distance dl to a main surface 101a of a semiconductor substrate 500a. The distance dl of the beam modifier device and widths of shading portions 710 of the beam modifier device 700 are selected such that cones of partial beams scattered in scattering portions 720 and exiting the beam modifier device 700 in the scattering portions 720 overlap with each other in a surface region that directly adjoins to the main surface 101a of the semiconductor substrate 500a to form a central doped zone 115a and a continuous JTE zone 117 directly adjoining to the central doped zone 115a.

The beam modifier device 700 includes a device region 810 with a central region 811 that may correspond to an active area of a semiconductor die formed in a chip area of the semiconductor substrate 500a and with a termination region 812 surrounding the central region 811. The beam modifier device 700 may further include an idle region 890 that corresponds to an area of the semiconductor substrate 500a including an outer edge region of the semiconductor die with a conductivity type opposite to that of the JTE zone 117 as well as a kerf area consumed by separating the semiconductor substrate 500a into a plurality of identical semiconductor dies.

The central region 811 may include one single scattering portion 720, one single absorption or shading region, or a plurality of regularly arranged shading and scattering portions. The termination region 812 includes shading portions 710 and scattering portions 720, wherein the area density of the scattering portions 720 decreases with increasing distance to the central region 811. Widths of the shading portions 710 and the distance dl between the beam modifier device 700 and the semiconductor substrate 500a are selected such that the cones of partial beams of the modified particle beam exiting through the patterned surface 702 in the scattering portions 720 overlap and superimpose on the main surface 101a.

FIG. 4A illustrates relative dimensions of the shading and the scattering portions 710, 720 as well as further details of the beam modifier device 700 such as shape and dimensions of dents and protrusions only schematically.

FIG. 4B shows a lateral dopant gradient 400 in the central doped zone 115a and the JTE zone 117 resulting from irradiation with the resulting modified particle beam at suitable dimensions of the dents and protrusions as well as the shading and the scattering portions 710, 720 of the beam modifier device 700. In portions of the central doped zone 115a and the JTE zone 117 in the vertical projection of uniformly distributed scattering portions 720, the dopant density is approximately uniform. Between portions of uniform dopant concentrations, the dopant concentration decreases with increasing distance to the central region 811. A lateral extension of the portions of uniform dopant concentration may be smaller than 400 μm. According to other embodiments, the lateral dopant gradient 400 steadily decreases and the JTE zone 117 is devoid of portions of uniform dopant concentration.

The scattering portions 720 may also modify the distribution of the dopants along the vertical direction perpendicular to the main surface 101a of the semiconductor substrate 500a. The dopant density is approximately uniform along a vertical range within the semiconductor substrate, wherein the extension of the vertical range is a function of the vertical extension of the dents 721 in the scattering portions 720.

FIG. 4C shows vertical dopant profiles 401, 402, 403 along lines C-C, D-D, and E-E in different lateral sections I, III, IV of the central doped zone 115a and the JTE zone 117 as indicated in FIG. 4A. The vertical dopant profiles 401, 402, 403 through different lateral sections of the central doped zone 115a and the JTE zone 117 include portions of constant dopant concentration, wherein the vertical extensions of uniform vertical dopant concentration may be equal in the different lateral sections I, II, III, IV of the central doped zone 115a and the JTE zone 117.

FIG. 4D refers to a semiconductor device 500 obtained from the semiconductor substrate 500a of FIG. 4A. The p-type central doped zone 115a and the p-type JTE zone 117 extend from a first surface 101 into a semiconductor portion 100 of the semiconductor device 500, which may be a power semiconductor diode, an IGFET, or an IGBT. The p-type central doped zone 115a and the p-type JTE zone 117 form a first pn junction pn1 with a lightly doped n-type drift structure 120 that forms a unipolar homojunction with a heavily doped n-type contact layer 129 formed along a second surface 102 opposite to the first surface 101.

FIG. 4E shows the electric field distribution in the semiconductor device 500 of FIG. 4D wherein the VLD-type JTE zone 117 smooths the lateral pn junction and the electric field along the first surface 101.

Figure 4F:
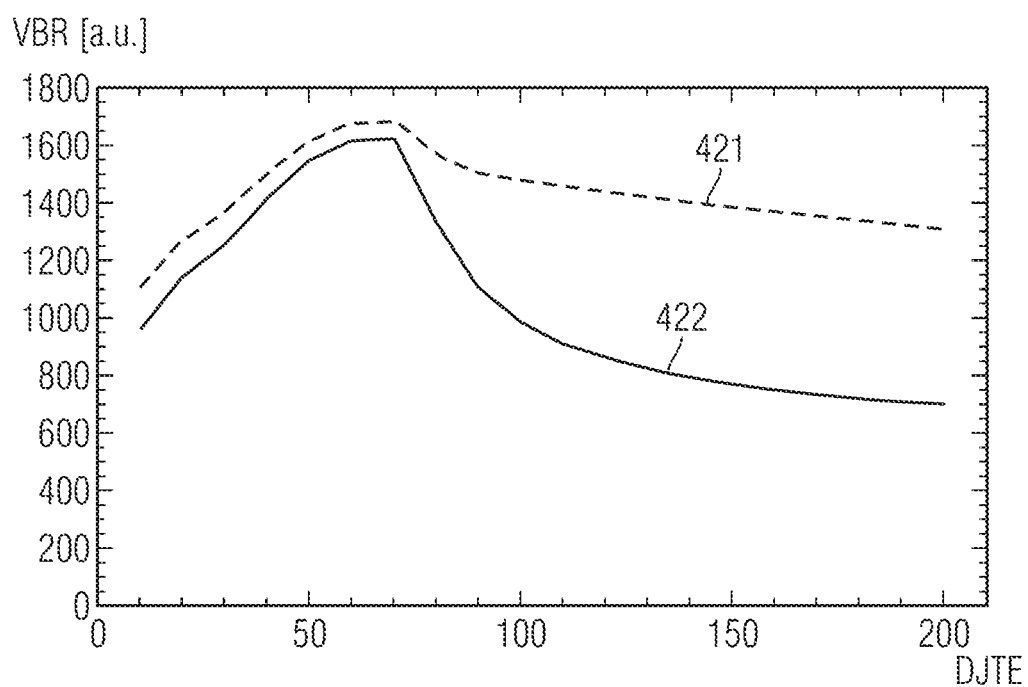
FIG. 4F is a schematic diagram showing a breakdown voltage of the semiconductor device of FIG. 4D as a function of a JTE dose.

In FIG. 4F curve 421 schematically shows the breakdown voltage VBR as a function of an JTE dose DJTE for the semiconductor device 500 with the VLD-type JTE zone 117 as illustrated in FIGS. 4E and 4F at a lateral extension of the graded portion of 10 µm. Curve 422 shows the breakdown voltage VBR for a reference example without VLD-type JTE zone 117. The VLD-type JTE zone 117 improves the breakdown voltage for a large range of the JTE dose DJTE.

Figure 4G:
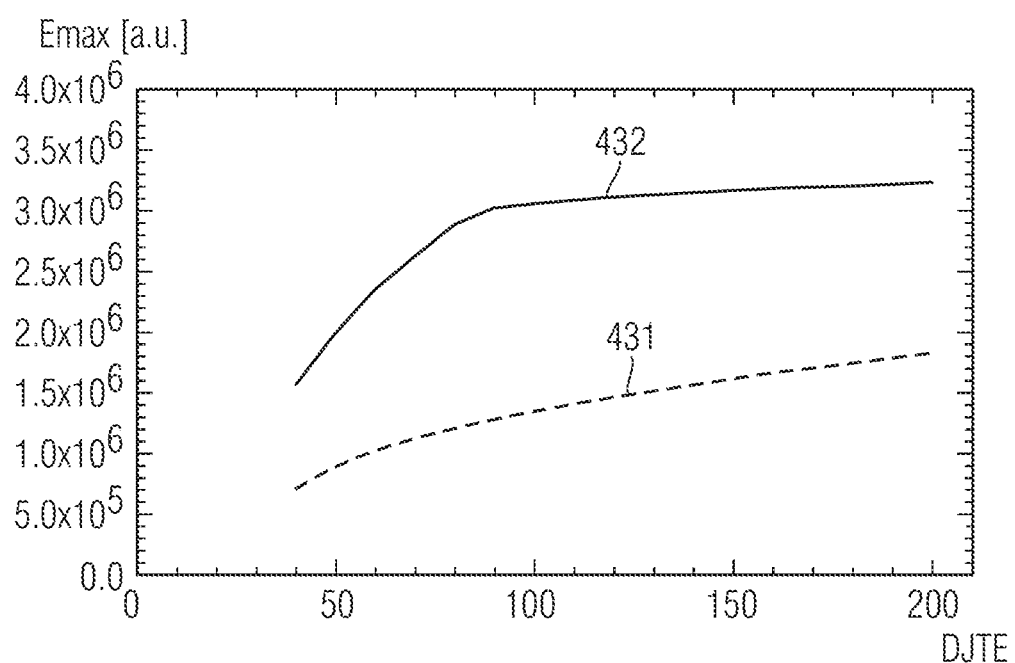
FIG. 4G is a schematic diagram showing a maximum electric field strength in the semiconductor device of FIG. 4D as a function of a JTE dose.

In FIG. 4G curve 431 shows the maximum electric field strength at the first surface 101 of the semiconductor device 500 with the VLD-type JTE zone 117 as illustrated in FIGS. 4D and 4E at a blocking voltage of 1200V at a lateral extension of the graded portion of 10 µm as a function of an JTE dose DJTE. Curve 432 shows the maximum electric field strength at a surface of a reference example without VLD-type JTE zone 117. The VLD-type JTE zone 117 significantly reduces the electric field strength for a large range of the JTE dose DJTE and improves reliability of the semiconductor device 500.

Figure 5A:
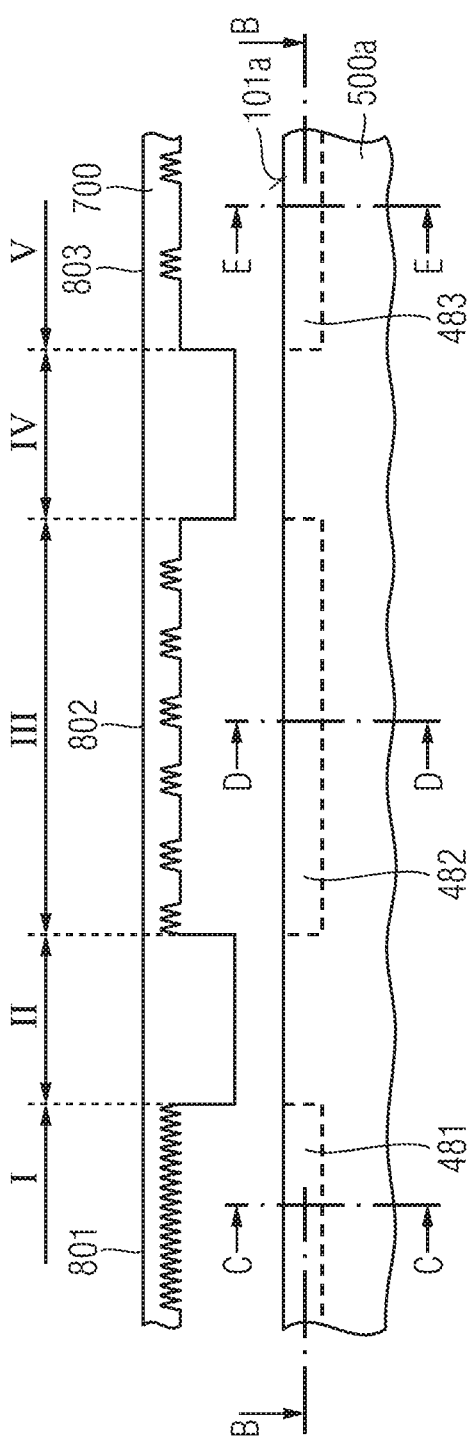
FIG. 5A is a schematic vertical cross-sectional view through a portion of a beam modifier device for illustrating effects of an embodiment concerning separated doped zones with different dopant concentration.
Figure 5B:
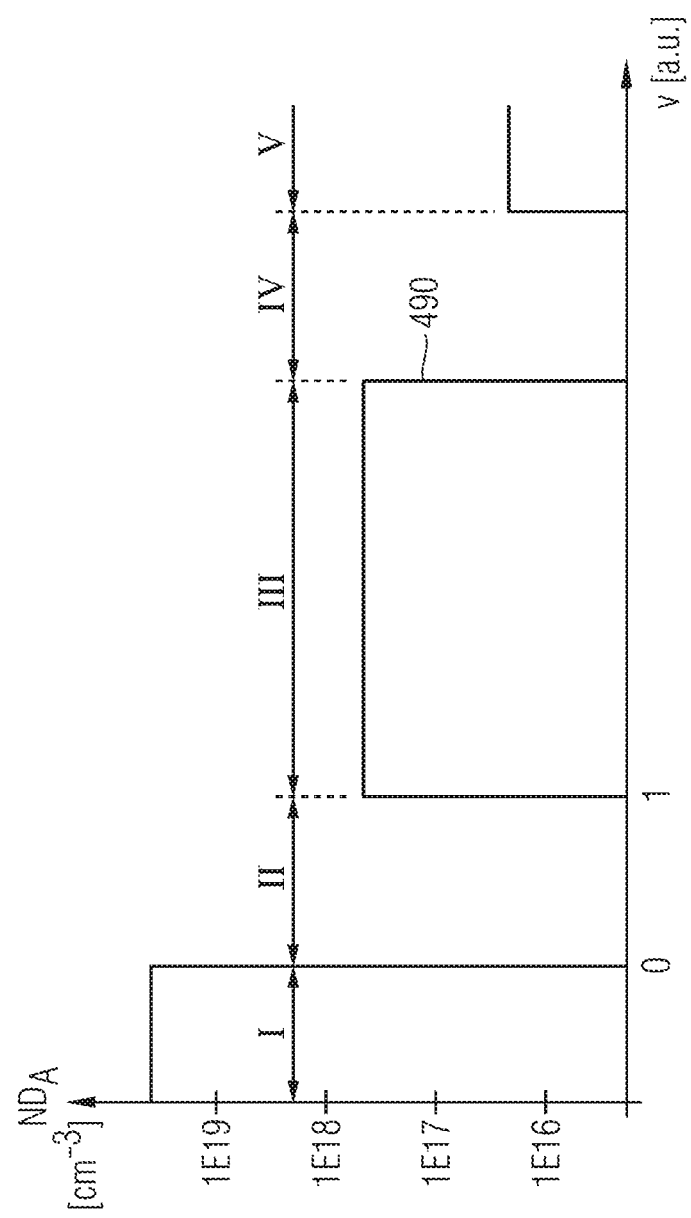
FIG. 5B is a schematic diagram illustrating a lateral dopant gradient along line B-B parallel to a main surface of the semiconductor substrate of FIG. 5A.
Figure 5C:
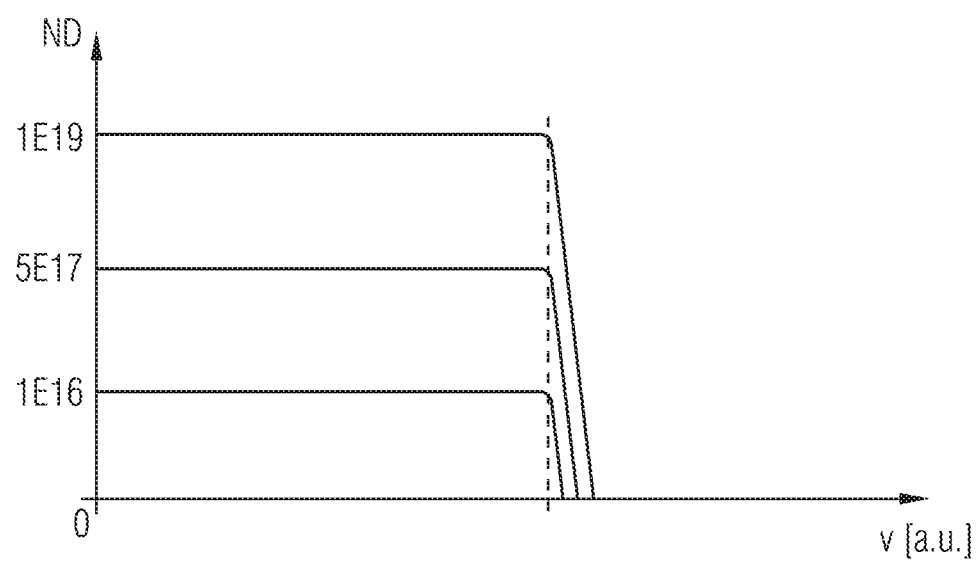
FIG. 5C is a schematic diagram illustrating vertical dopant gradients along lines C-C, D-D, and E-E orthogonal to the main surface of the semiconductor substrate of FIG. 5A.

FIGS. 5A to 5C refer to an embodiment with a beam modifier device 700 adapted to form doped zones 481, 482, 483 of different maximum dopant concentrations in different regions of a semiconductor substrate 500a.

In FIG. 5A, an area ratio of the scattering portions 720 is greater in a first section 801 of the beam modifier device 700 than in a second section 802 and in the second section 802 greater than in a third section 803. Shading portions 710 separate the first, second and third sections 801, 802, 803 from each other. More particles per area unit pass through the scattering portions 720 in the first section 801 than through the scattering portions 720 of the second section 802, wherein the scattering portions 720 spread the particles uniformly in portions of the semiconductor substrate 500a corresponding to the first, second and third sections 801, 802, 803.

In the semiconductor substrate 500a the modified particle beam generates isolated doped zones 481, 482, 483 of different maximum dopant concentrations and with the same vertical extension in one single implant step.

FIG. 5B shows a lateral dopant profile 490 along horizontal line B-B through the doped zones 481, 482, 483.

FIG. 5C shows vertical dopant profiles 491, 492, 493 along lines C-C, D-D, and E-E through the doped zones 481, 482, of FIG. 5A.

FIG. 6 illustrates a method of manufacturing a semiconductor device, wherein the method includes formation of doped zones in a semiconductor substrate by the use of a beam modifier device.

A particle beam is generated (610). The particles of the particles beam may be atoms/ions of group 13 or group 15 elements, by way of example. The particle beam is modified by a beam modifier device, wherein first beam portions of a modified particle beam are attenuated and second beam portions of the modified particle beam alternating with the first beam portions are scattered and cones of neighboring second beam portions overlap in a plane perpendicular to a propagation direction of the particle beam (620). The method facilitates formation of doped zones of different dopant concentrations during one single implant as well as a lateral variation of doping in a doped zone.

FIGS. 7A to 7E refer to a method for forming JTE zones 117 of lateral variation of doping in combination with the formation of alignment marks 182 used for aligning further structures to the JTE zones 117.

Figure 7A:
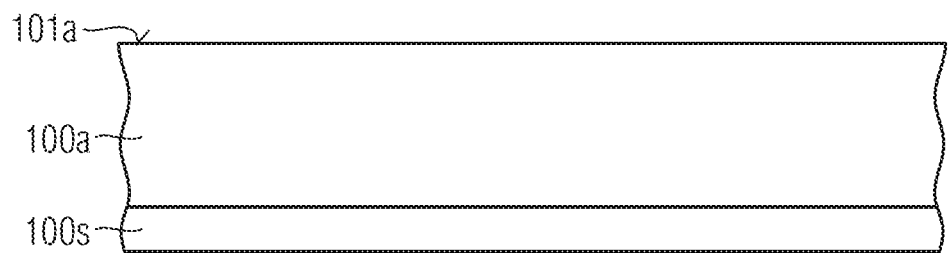
FIG. 7A is a schematic vertical cross-sectional view of a semiconductor substrate for illustrating a method of manufacturing a semiconductor device by using a beam modifier device, after forming an epitaxial layer on a base substrate.

FIG. 7A shows a semiconductor substrate 500a including a semiconductor layer 100a of crystalline semiconductor material, in which a diffusion length of dopants at tolerable temperatures is low. According to an embodiment, the semiconductor substrate 500a consists of silicon carbide or includes a layer of silicon carbide. For example, the semiconductor substrate 500a includes a base substrate 100s formed from a slice cut from a silicon carbide ingot and an epitaxy layer formed by epitaxy on a process surface of the base substrate 100s and forming the semiconductor layer 100a.

Figure 7B:
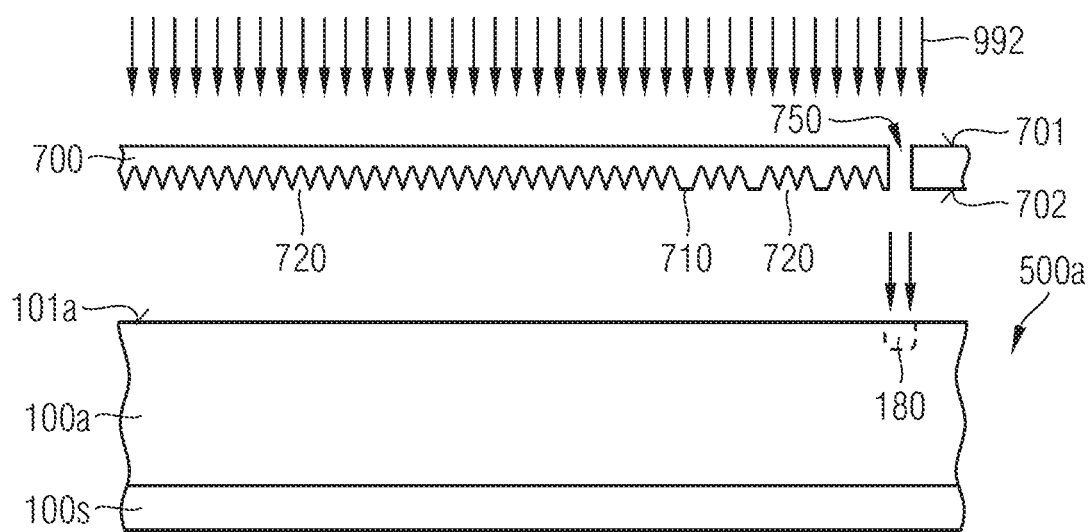
FIG. 7B shows the semiconductor substrate of FIG. 7A during irradiation with a high-dose, low energy particle beam to form amorphized zones.

The semiconductor substrate 500a is placed in an ion implantation apparatus. A beam modifier device 700 is placed between a particle source and the semiconductor substrate 500a. The beam modifier device 700 may be a membrane or foil that includes openings 750 transparent for particles, shading portions 710 strongly attenuating or impermeable for the particles of a particle beam generated by the particle source as well as scattering portions 720 that widen up cones of partial beams of a modified particle beam exiting the beam modifier device 700 through a patterned surface 702 opposite to an exposure surface 701, which is oriented to the particle source. A distance between the beam modifier device 700 and a main surface 101a of the semiconductor substrate 500a is selected such that cones of the scattered partial beams exiting through the patterned surface 702 in the scattering portions 720 partially overlap in a surface region of the semiconductor substrate 500a. As illustrated in FIG. 7B, a first particle beam 992 with low energy and a high dose greater than a critical dose beyond which the particles amorphize the semiconductor layer 100a is generated and directed onto the exposure surface 701 of the beam modifier device 700. Due to the low energy, the particles pass only the openings 750. Due to the high dose of the particle beam, portions of the semiconductor substrate 500a in the vertical projection of the openings 750 are amorphized and form amorphized alignment zones 180.

Figure 7C:
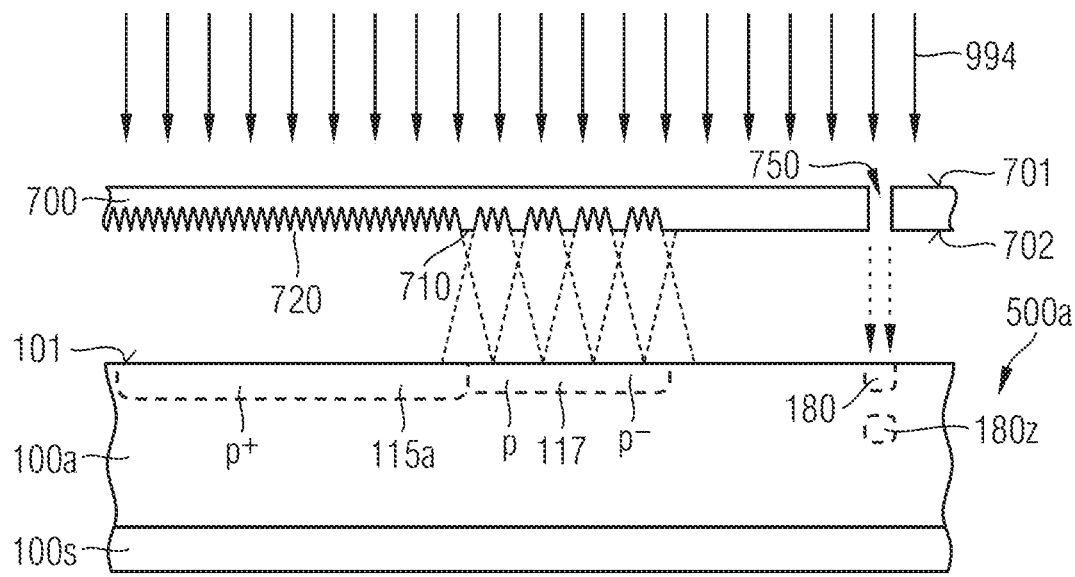
FIG. 7C shows the semiconductor substrate of FIG. 7B during irradiation with a low-dose, high energy particle beam to form doped zones.

Before or after irradiation with the low-energy, high-dose first particle beam 992 of FIG. 7C, a high-energy second particle beam 994 is irradiated onto the exposure surface 701 at a low dose below the critical dose at which the material of the semiconductor layer 100a amorphizes, but at an energy high enough to let the particles pass at least the scattering portions 720 of the beam modifier device 700.

Particles passing through the openings 750 generate a buried implant zone 180z in the vertical projection of the alignment zone 180 at a distance to the first surface 101a.

The shading portions 710 may completely absorb or at least significantly attenuate the particle beam. The scattering portions 720 expand cones of partial beams of a modified particle beam exiting the beam modifier device 700 in the scattering portions 720 into direction of the semiconductor substrate 500a. Neighboring cones overlap at least in the vertical projection of the shading portions 710. Due to a lateral variation of the area ratio between shading portions 710 and scattering portions 720, the dopant concentration in a JTE zone 117 decreases with increasing distance to a central doped zone 115a at the left hand side.

Since the beam modifier device 700 and the semiconductor substrate 500a do not change their positions between irradiation with the first particle beam 992 and irradiation with the second particle beam 994, the central doped zone 115a and the JTE zone 117 formed by the second particle beam 994 are aligned to the amorphized alignment zones 180 formed by the first particle beam 992.

The amorphized alignment zones 180 may be removed by wet etching using an etchant including flour and an oxidizing component, for example a mixture of a hydrofluoric acid (HF) and nitric acid (HNO$_3$) at a ratio per volume of 1:1, wherein alignment pits 181 are formed from the amorphized alignment zones 180.

Figure 7D:
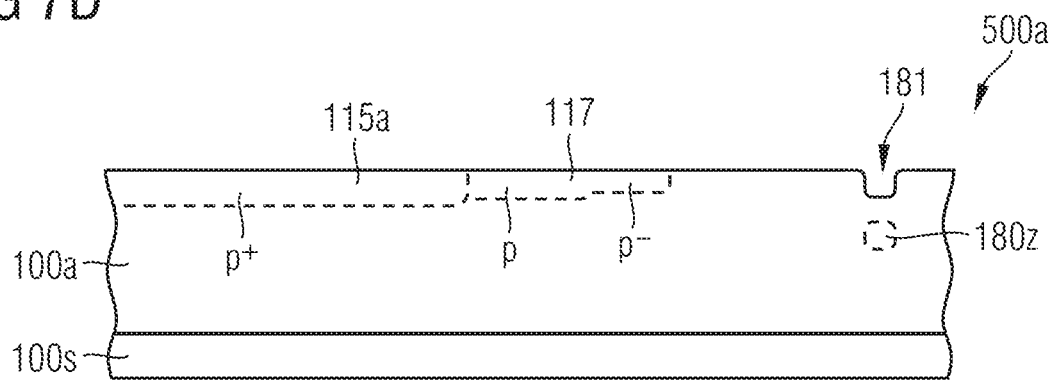
FIG. 7D shows the semiconductor substrate of FIG. 7C after forming alignment pits by etching from the amorphized zones.

FIG. 7D shows the alignment pits 181 formed by selectively removing the amorphized alignment zones 180 of FIG. 7B.

Figure 7E:
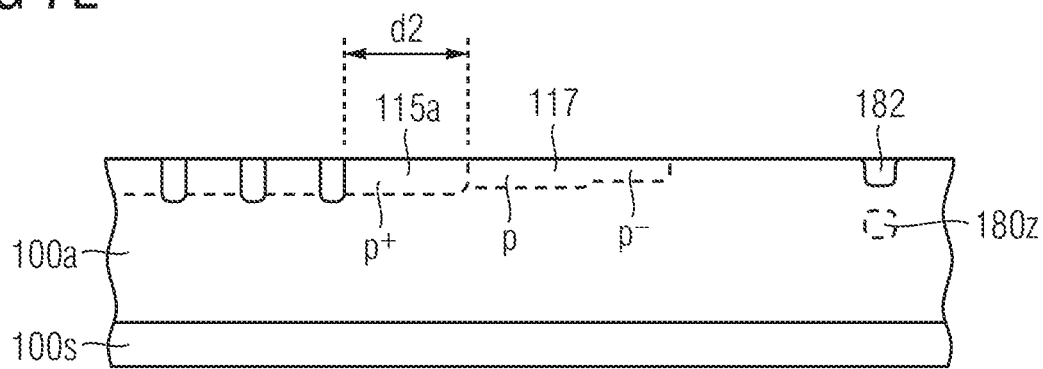
FIG. 7E shows the semiconductor substrate of FIG. 7D after forming trench structures aligned to the doped zones by use of alignment marks based on the alignment pits of FIG. 7D.

Using the alignment pits 181 of FIG. 7D or alignment marks 182 formed by filling the alignment pits 181 with an auxiliary material, or by implanting additional regions, e.g., for MPS structures, a photolithographic mask may be brought into alignment with the semiconductor substrate 500a, such that, by way of example. A hard mask defining trenches for trench gate structures 150 in the central doped zone 115a can be aligned to the alignment pits 181 of FIG. 7D or the alignment marks 182 and, inherently to the JTE zone 117 as shown in FIG. 7E.

Since the area portion of shading portions 710 increases with respect to the area portion of the scattering portions 720 with increasing distance to the central doped zone 115a, within the JTE zone 117, the surface dopant concentration, which is the integral across the dopant concentration in the JTE zone 117 along the vertical direction, decreases with increasing distance to the central doped zone 115a.

Alternatively or in addition to increasing the area portion of the shading portions 710, the dents 721 of the scattering portions 720 may become shallower with increasing distance to the central doped zone 115a such that a base thickness between the bottom of the dents 721 and the exposure surface 701 of the beam modifier device 700 increases and in total less particles pass through the scattering portions 720 with the shallower dents 721. Since the implant depth of the particles in the semiconductor layer 100a is a function of the vertical extension of the dents 721 and protrusions 722, both the surface dopant concentration and the vertical extension of the JTE zone 118 may decrease with increasing distance to the central doped zone 115a, wherein the vertical extension of the JTE zone 118 may decrease steadily or in steps.

Figure 8:
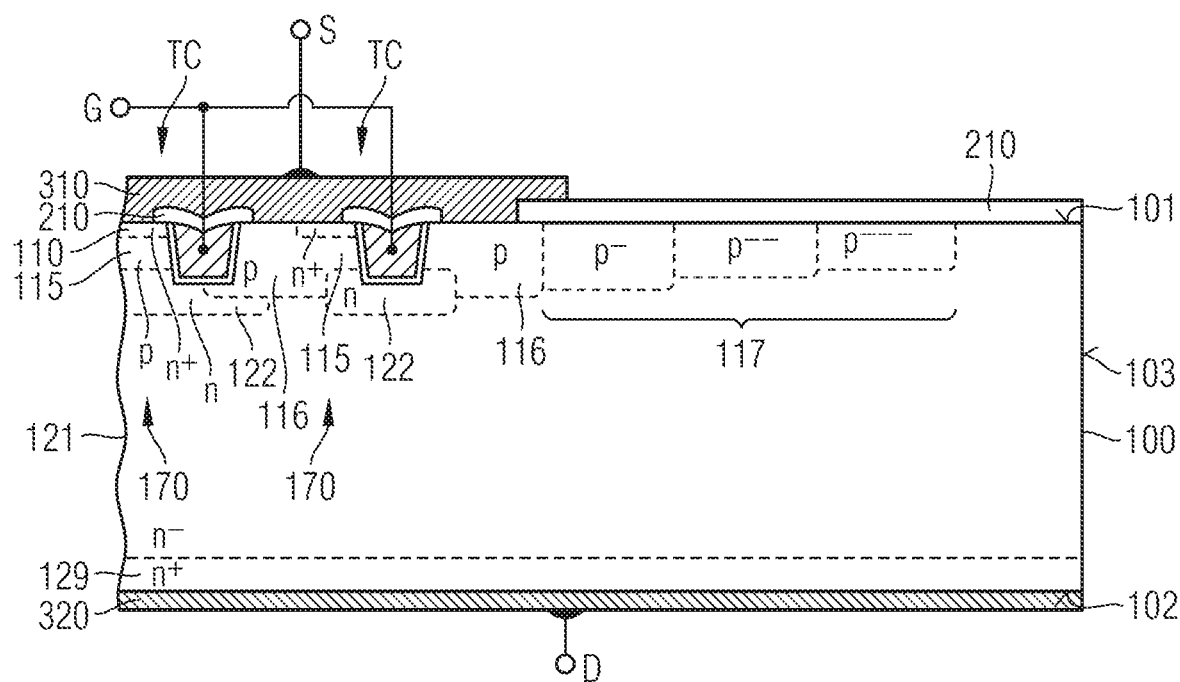
FIG. 8 is a schematic vertical cross-sectional view of a portion of a semiconductor device including a JTE (junction termination extension) based on a VLD (variation of lateral doping) structure.

FIG. 8 refers to an SiC semiconductor device 500 including transistor cells TC, wherein the semiconductor device 500 may be or may include, e.g., an UMOSFET with U-shaped trench gate structures 150 extending from a first surface 101 into a semiconductor portion 100. The semiconductor portion 100 may be based on 4H-SiC, 2H-SiC, 6H-SiC or 15R-SiC.

At a front side the semiconductor portion 100 has a first surface 101, which may be planar or which may include coplanar or staggered surface sections. On the back an opposite second surface 102 may extend parallel or tilted to the first surface 101. A distance between the first surface 101 at the front side and the second surface 102 on the back is related to a nominal blocking voltage of the semiconductor device 500. Typically, the semiconductor portion 100 includes a first vertical portion that accommodates the applied electric field in the blocking state, wherein the thickness of the first portion is proportional to the nominal blocking voltage and defines the electric field breakdown strength, whereas a thickness of further vertical portions, e.g., a substrate portion, is not related to the nominal blocking voltage.

A total thickness of the semiconductor portion 100 between the first and second surfaces 101, 102 may be in the range of several hundred nm to several hundred µm. The normal to the first surface 101 defines a vertical direction. Directions parallel to the first surface 101 are horizontal directions.

The transistor cells TC are formed along trench gate structures 150, which extend from the first surface 101 into the semiconductor portion 100, wherein portions of the semiconductor portion 100 between neighboring trench gate structures 150 form mesa portions 170.

A longitudinal extension of the trench gate structures 150 along a first horizontal direction may be greater than a width along a second horizontal direction orthogonal to the first horizontal direction. The trench gate structures 150 may be long stripes extending from one side of a transistor cell area to an opposite side, wherein the length of the trench gate structures 150 may be up to several millimeters. According to other embodiments a plurality of separated trench gate structures 150 may be arranged along a line extending from one side of the transistor cell area to the opposite side, or the trench gate structures 150 may form a grid with the mesa portions 170 formed in the meshes of the grid.

The trench gate structures 150 may be equally spaced, may have equal width, and may form a regular pattern, wherein a pitch (center-to-center distance) of the trench gate structures 150 may be in a range from 1 µm to 10 µm, e.g., from 2 µm to 5 µm. A vertical extension of the trench gate structures 150 may be in a range from 0.3 µm to 5 µm, e.g., in a range from 0.5 µm to 2 µm.

The trench gate structures 150 include a conductive gate electrode 155 which may include or consist of a heavily doped polycrystalline silicon layer or a metal-containing layer. The trench gate structures 150 further include a gate dielectric 151 separating the gate electrode 155 from the semiconductor portion 100 along at least one side of the trench gate structure 150. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.5 V to 6 V.

The trench gate structures 150 may exclusively include the gate electrode 155 and the gate dielectric 151 or may include further conductive and/or dielectric structures in addition to the gate electrode 155 and the gate dielectric 151. The trench gate structures 150 may be vertical to the first surface 101 or may taper with increasing distance to the first surface 101.

The mesa portions 170 include source zones 110 that are oriented to the front side and that directly adjoin to the trench gate structure 150 of at least one transistor cell TC. The source zones 110 may directly adjoin to the first surface 101 and may be spaced from the trench gate structure 150 of a neighboring transistor cell TC.

The mesa portions 170 further include body zones 115 that separate the source zones 110 from a drift structure 120, wherein the body zones 115 form first pn junctions with a drift structure 120 and second pn junctions with the source zones 110. The body zone 115 of a transistor cell TC directly adjoins to the trench gate structure 150 of the transistor cell TC. Portions of the body zones 115 are capacitively coupled to the gate electrode 155 through the gate dielectric 151. Both the source zones 110 and the body zones 115 are electrically connected to a first load electrode 310 at the front side. A vertical extension of the body zones 115 corresponds to a channel length of the transistor cells TC and may be in a range from 0.2 μm to 1.5 μm.

The semiconductor portion 100 may further include diode regions 116 forming third pn junctions with the drift structure 120. The diode regions 116 are electrically connected or coupled to the first load electrode 310 and may vertically overlap with the trench gate structures 150 such that portions of the diode regions 116 are formed in the vertical projection of the trench gate structures 150. A distance between opposing edges of neighboring diode regions 116 may be in a range from 2 μm to 3 μm, by way of example.

A vertical extension of the diode regions 116 may be greater than a vertical extension of the trench gate structures 150 such that portions of the diode regions 116 overlap with the vertical projection of the trench gate structures 150 and shield active portions of the gate dielectric 151 against the high potential of the second load electrode 320 in a blocking state of the semiconductor device 500. The diode regions 116 provide a fly back diode functionality integrated in the semiconductor device 500. Further, the diode regions 116 may connect the body zones 115 with contact structures 315.

The drift structure 120 is oriented to the back, may directly adjoin to the second surface 102 and may be electrically connected or coupled to a second load electrode 320 through an ohmic contact or through a further pn junction. The drift structure 120 may include a lightly doped drift zone 121, which may form the first and third pn junctions, as well as a heavily doped contact layer 129 between the drift zone 121 and the second surface 102.

A net dopant concentration in the drift zone 121 may be in a range from $1E14$ $cm^{-3}$ to $3E16$ $cm^{-3}$ in case the semiconductor portion 100 is formed from silicon carbide. A mean dopant concentration in the contact layer 129 is sufficiently high to ensure an ohmic contact with a second load electrode 320 that directly adjoins to the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

The drift structure 120 may include current spread zones 122 which may directly adjoin to the body zones 115. The current spread zones 122 may extend between neighboring diode regions 116, wherein unipolar homojunctions between the current spread zones 122 and the drift zone 121 may have a greater distance to the first surface 101 than the third pn junctions formed between the diode regions 116 and the drift zone 121. Portions of the current spread zones 122 may overlap with the vertical projection of the diode regions 116 and may extend between neighboring diode regions 116.

A mean net dopant concentration in the current spread zones 122 is at least ten times as high as a mean net dopant concentration in the drift zone 121. The reduced horizontal resistance of the current spread zones 122 laterally spreads an on-state current of the transistor cells TC such that a current distribution in the drift zone 121 is more uniform.

A dielectric structure 210 insulates the gate electrodes 155 from the first load electrode 310. Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal, which may be an anode terminal of an MCD, a source terminal S of an UMOSFET or an emitter terminal of an IGBT. The second load electrode 320 may form or may be electrically connected or coupled to a second load terminal, which may be a cathode terminal of an MCD, a drain terminal D of an UMOSFET or a collector terminal of an IGBT.

According to an embodiment, the transistor cells TC are n-channel FET cells with p-doped body zones 115 and n-doped source zones 110, wherein the diode regions 116 are p-doped and the drift zone 121 is n-doped. According to another embodiment, the transistor cells TC are p-channel FET cells with n-doped body zones 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones 110 with the drift structure 120, thereby turning on the semiconductor device 500. In the on-state, a load current flows through the semiconductor portion 100 approximately along the vertical direction between the first and second load electrodes 310, 320.

A JTE zone 117 forms a unipolar homojunction with the body zone 115 or the diode region 116 of the outermost transistor cell TC. The JTE zone 117 extends along the first surface 101 from the body zone 115 or the diode region 116 into a direction of the outer lateral surface 103. A lateral doping profile of the JTE zone 117 parallel to the first surface 101 includes portions of uniform dopant concentration connected by portions of approximately linearly decreasing dopant concentration. A portion of the dielectric structure 210 may separate the JTE zone 117 from the first load electrode 310.

JTE zones with steadily decreasing dopant concentration towards an outer edge as described above may be implemented for other semiconductor switching devices, e.g., in switching devices with planar gate electrode or compensation structures as well.

Figure 9:
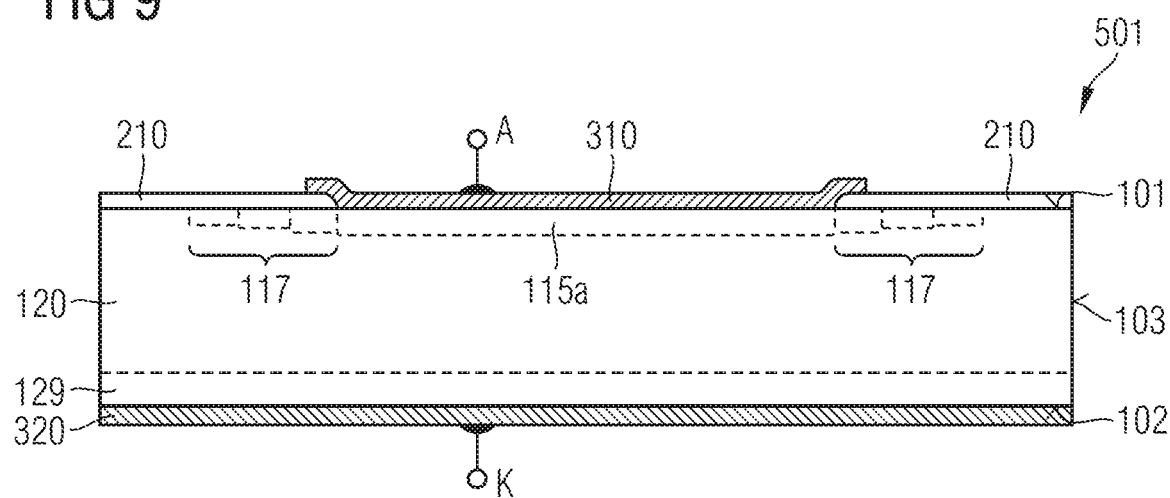
FIG. 9 is a schematic vertical cross-sectional view of a portion of power semiconductor diode including a junction termination extension based on a VLD structure.

The silicon carbide semiconductor diode 501 of FIG. 9 shows a central doped zone 115a effective as anode zone and a JTE zone 117 surrounding the central doped zone 115a. For further details, reference is made to the description of FIG. 8, wherein the first load electrode 310 forms or is electrically connected to an anode terminal A and the second load electrode 320 forms or is electrically connected to a cathode terminal K of the semiconductor diode 501.

Although specific embodiments have been illustrated and described herein, it will be appreciated by those of ordinary skill in the art that a variety of alternate and/or equivalent implementations may be substituted for the specific embodiments shown and described without departing from the scope of the general inventive concept. This application is intended to cover any adaptations or variations of the specific embodiments discussed herein. Therefore, it is intended only to be limited by the claims and the equivalents thereof.

What is claimed is:

1. A semiconductor device, comprising:
   a central doped zone extending from a first surface into a silicon carbide semiconductor portion at a distance to an outer lateral surface of the semiconductor portion, wherein the central doped zone forms a pn junction with a drift structure in the semiconductor portion; and a junction termination extension zone forming a unipolar homojunction with the central doped zone, the junction termination extension zone extending along the first surface from the central doped zone into a direction of the outer lateral surface, wherein a lateral doping profile of the junction termination extension zone parallel to the first surface includes a plurality of uniform portions of uniform dopant concentration interleaved with a plurality of decreasing portions of approximately linearly decreasing dopant concentration, wherein each of the plurality of decreasing portions decreases in decreasing dopant concentration by substantially a same dopant concentration amount such that each successive uniform portion of the plurality of uniform portions in the direction towards the outer lateral surface is decreased by substantially the same dopant concentration amount.

2. The semiconductor device of claim 1, wherein a vertical extension of the junction termination extension zone is smaller than a vertical extension of the central doped zone.

3. The semiconductor device of claim 1, wherein:

the junction termination extension zone includes a surface region at the first surface that extends laterally along the first surface from the central region to an outer edge region, and the lateral doping profile of the surface region includes the uniform portions of uniform dopant concentration connected through the decreasing portions of approximately linearly decreasing dopant concentration, wherein, at the surface region, each of the plurality of decreasing portions decreases in decreasing dopant concentration by substantially the same dopant concentration amount such that each successive uniform portion of the plurality of uniform portions in the direction towards the outer lateral surface is decreased by substantially the same dopant concentration amount.

4. The semiconductor device of claim 3, wherein the uniform portions of uniform dopant concentration alternate with the decreasing portions of approximately linearly decreasing dopant concentration on a one-by-one basis.

5. The semiconductor device of claim 1, wherein:

the plurality of uniform portions include a first uniform portion, a second uniform portion, and a third uniform portion arranged laterally in increasing distance from the central doped zone, and a first difference in dopant concentration between the first uniform portion and the second uniform portion is substantially the same as a second difference in dopant concentration between the second uniform portion and the third uniform portion.

6. A semiconductor device, comprising:

a silicon carbide substrate including a main surface at which a plurality of doped zones are formed in a junction termination extension zone of the silicon carbide substrate, the plurality of doped zones are arranged such that a lateral dopant concentration gradient is formed that decreases from a central region of the silicon carbide substrate to an outer edge region of the silicon carbide substrate, wherein the junction termination extension zone includes a surface region at the main surface that extends laterally along the main surface from the central region to the outer edge region, and wherein the lateral dopant concentration gradient of the surface region is smooth and steadily decreases from the central region to the outer edge region, wherein the silicon carbide substrate includes an idle region at the outer edge region of the silicon carbide substrate, wherein the plurality of doped zones have a first conductivity type and the idle region has a second conductivity type opposite to the first conductivity type, wherein the junction termination extension zone extends from the central region to the idle region, wherein the idle region includes at least one amorphized alignment zone at the main surface, and wherein the at least one amorphized alignment zone is laterally separated from the junction termination extension zone and has a dopant concentration greater than a maximum dopant concentration of the junction termination extension zone.

7. The semiconductor device of claim 6, wherein the lateral dopant concentration gradient is smooth and steadily decreases throughout the junction termination extension zone from the central region to the outer edge region.

8. The semiconductor device of claim 6, wherein the lateral dopant concentration gradient is smooth and linearly decreases throughout the junction termination extension zone from the central region to the outer edge region.

9. The semiconductor device of claim 6, wherein neighboring doped zones of the plurality of doped zones laterally overlap with each other to form the junction termination extension zone that is continuous.

10. The semiconductor device of claim 6, wherein the junction termination extension zone makes up a termination region of the silicon carbide substrate, where the termination region surrounds the central region of the silicon carbide substrate.

11. The semiconductor device of claim 10, wherein:

the silicon carbide substrate includes an idle region at the outer edge region of the silicon carbide substrate, the plurality of doped zones have a first conductivity type and the idle region has a second conductivity type opposite to the first conductivity type, and the junction termination extension zone extends from the central region to the idle region.

12. The semiconductor device of claim 6, wherein the idle region includes at least one buried implant zone vertically aligned, but vertically spaced apart from, the at least one amorphized alignment zone, wherein a drift zone of the silicon carbide substrate vertically separates an amorphized alignment zone from a buried implant zone that is vertically aligned with the amorphized alignment zone.

13. The semiconductor device of claim 6, wherein the central region includes a central doped zone at the main surface, and a maximum dopant concentration in the junction termination extension zone is less than a dopant concentration of the central doped zone.

14. The semiconductor device of claim 13, wherein in the central doped zone forms a homojunction with the junction termination extension zone.

15. The semiconductor device of claim 14, wherein:

the silicon carbide substrate includes a drift structure at a depth below the central doped zone and the junction termination extension zone, and the central doped zone and the junction termination extension zone form a pn junction with the drift structure.

16. The semiconductor device of claim 6, wherein the silicon carbide substrate is a silicon carbide wafer.

17. A semiconductor device, comprising:
a silicon carbide substrate including a main surface at which a plurality of doped zones are formed in a junction termination extension zone of the silicon carbide substrate, the plurality of doped zones are arranged such that a lateral dopant concentration gradient is formed that decreases from a central region of the silicon carbide substrate to an outer edge region of the silicon carbide substrate,
wherein the junction termination extension zone includes a surface region at the main surface that extends laterally along the main surface from the central region to the outer edge region,
the lateral dopant concentration gradient of the surface region includes a first section, a second section, and a third section disposed between the first section and the second section, and
a dopant concentration of the first section decreases laterally with increasing distance from the central region, a dopant concentration of the second section decreases laterally with increasing distance from the central region, and a dopant concentration of the third section is uniform,
wherein the first section is defined by a first lateral endpoint and a second lateral endpoint,
wherein the second section is defined by a third lateral endpoint and a fourth lateral endpoint,
wherein the dopant concentration of the first section decreases from the first lateral endpoint to the second lateral endpoint by a first amount, and
wherein the dopant concentration of the second section decreases from the third lateral endpoint to the fourth lateral endpoint by a second amount that is substantially equal to the first amount.

18. A semiconductor device, comprising:
a silicon carbide substrate including a main surface at which a plurality of doped zones are formed in a junction termination extension zone of the silicon carbide substrate, the plurality of doped zones are arranged such that a lateral dopant concentration gradient is formed that decreases from a central region of the silicon carbide substrate to an outer edge region of the silicon carbide substrate,
wherein the junction termination extension zone includes a surface region at the main surface that extends laterally along the main surface from the central region to the outer edge region, and
wherein the lateral dopant concentration gradient of the surface region is smooth and steadily decreases from the central region to the outer edge region,
wherein the silicon carbide substrate includes an idle region at the outer edge region of the silicon carbide substrate,
wherein the plurality of doped zones have a first conductivity type and the idle region has a second conductivity type opposite to the first conductivity type,
wherein the junction termination extension zone extends from the central region to the idle region,
wherein the idle region includes at least one alignment pit of removed silicon carbide substrate that extends from the main surface into the silicon carbide substrate, and
wherein the at least one alignment pit is laterally separated from the junction termination extension zone.

19. The semiconductor device of claim 18, wherein the idle region includes at least one buried implant zone vertically aligned, but vertically spaced apart from, the at least one alignment pit,
wherein a drift zone of the silicon carbide substrate vertically separates an alignment pit from a buried implant zone that is vertically aligned with the alignment pit.

20. The semiconductor device of claim 18, wherein the at least one alignment pit is filled with an auxiliary material.

* * * * *